United States Patent [19]

Hoshi et al.

[11] Patent Number: 5,068,831
[45] Date of Patent: Nov. 26, 1991

[54] DATA READ CIRCUIT FOR SEMICONDUCTOR STORAGE DEVICE

[75] Inventors: Satoru Hoshi; Masami Masuda, both of Kawasaki; Takayuki Kawaguchi, Yokohama, all of Japan

[73] Assignee: Kabushiki Kaisha Toshiba, Kawasaki, Japan

[21] Appl. No.: 550,025

[22] Filed: Jul. 9, 1990

[30] Foreign Application Priority Data

Jul. 12, 1989 [JP] Japan .................................. 1-179816

[51] Int. Cl.$^5$ .............................................. G11C 7/00
[52] U.S. Cl. .............................. 365/203; 365/189.05; 365/189.09; 365/190; 365/208; 365/233.5; 307/530
[58] Field of Search ...................... 365/189.05, 189.09, 365/190, 203, 207, 208, 233.5; 307/530

[56] References Cited

U.S. PATENT DOCUMENTS 4,943,944 7/1990 Sakui et al. ...................... 365/203

Primary Examiner—Joseph E. Clawson, Jr.
Attorney, Agent, or Firm—Foley & Lardner

[57] ABSTRACT

In a data read circuit, for a semiconductor storage device, data of a memory cell (11) selected according to an address is inputted to a sense amplifier (22) via a pair of complementary first data lines (N1 to N6). The sense amplifier outputs the inputted and amplified data to a pair of complementary second data lines (N7, N8). First switching means (Tr3) equalizes the pair of complementary first data lines (N5, N6) at the input side of the sense amplifier (22) by making the first data lines conductive with respect to each other. Second switching means (Tr4) equalizes the pair of complementary second data lines (N7, N8) by making the second data lines conductive with respect to each other. Third switching means (Tr5, Tr6) equalizes by making the pair of first data lines (N5, N6) at the input side of the sense amplifier (22) and corresponding ones of the pair of second data lines (N7, N8) conductive with respect to each other. Second equalizing pulse generator means (42) generates a second equalizing pulse ($\Phi_{eq}'$) when the address is changed, and turns on the first switch means (Tr3) by applying the second equalizing pulse to a control terminal of the first switch means. First equalizing pulse generator means (41) generates a first equalizing pulse ($\Phi_{eq}$) when the address is changed, and turns on the second and third switching means (Tr4, Tr5, Tr6) by applying the second equalizing pulse to gate terminals of the second and third switching means. The load capacitance $]C(\Phi_{eq}')]$ connected to an output terminal of the second equalizing pulse generating means (42) is set smaller than the load capacitance $[C(\Phi_{eq})]$ connected to an output terminal of the first equalizing pulse generator means (41). The number of stages of logical circuits constituting the second equalizing pulse generator means (42) is smaller than the number of stages of logical circuits constituting the first equalizing pulse generator means (41). Accordingly, with this data read circuit for a semiconductor storage device, the second equalizing pulse ($\Phi_{eq}'$) from the second equalizing pulse generator means (42) is established earlier than the first equalizing pulse ($\Phi_{eq}$) from the first equalizing pulse generator means (41).

12 Claims, 6 Drawing Sheets

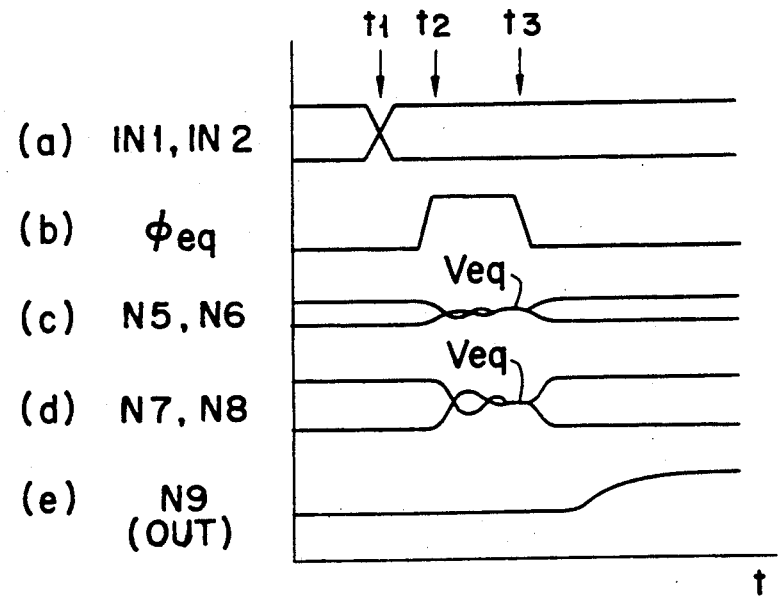
F I G. 7
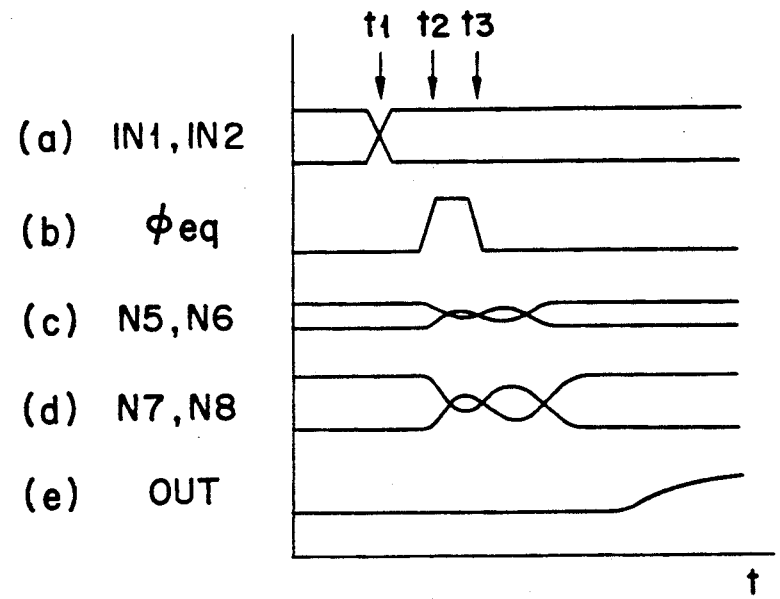
F I G. 8

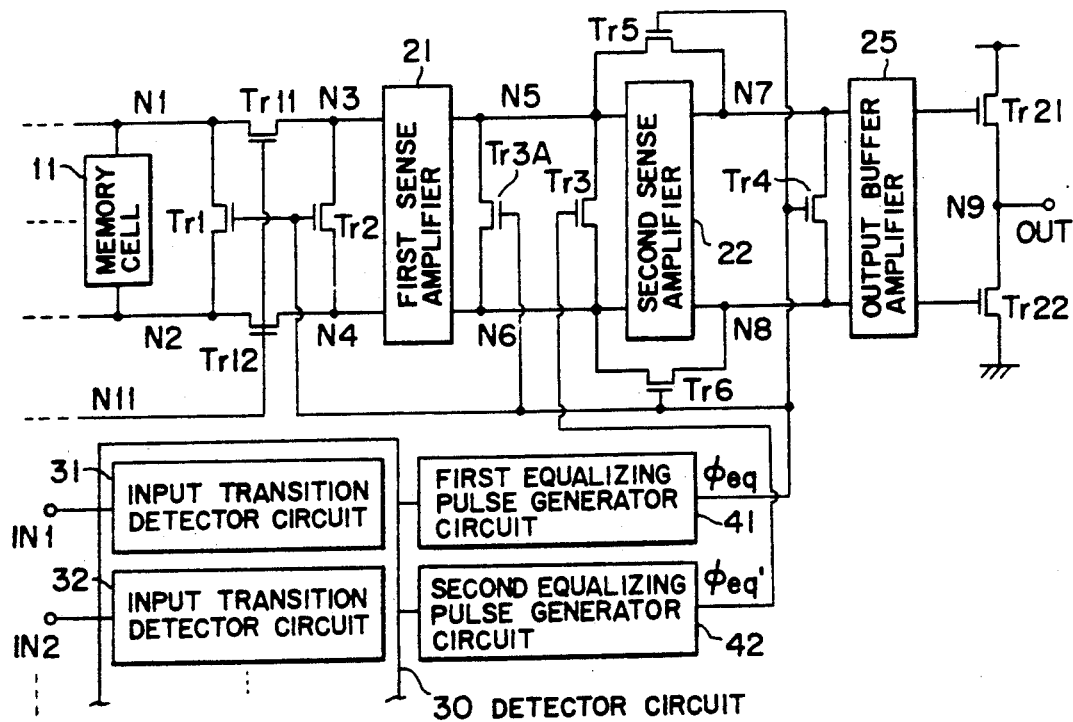
F I G. 13
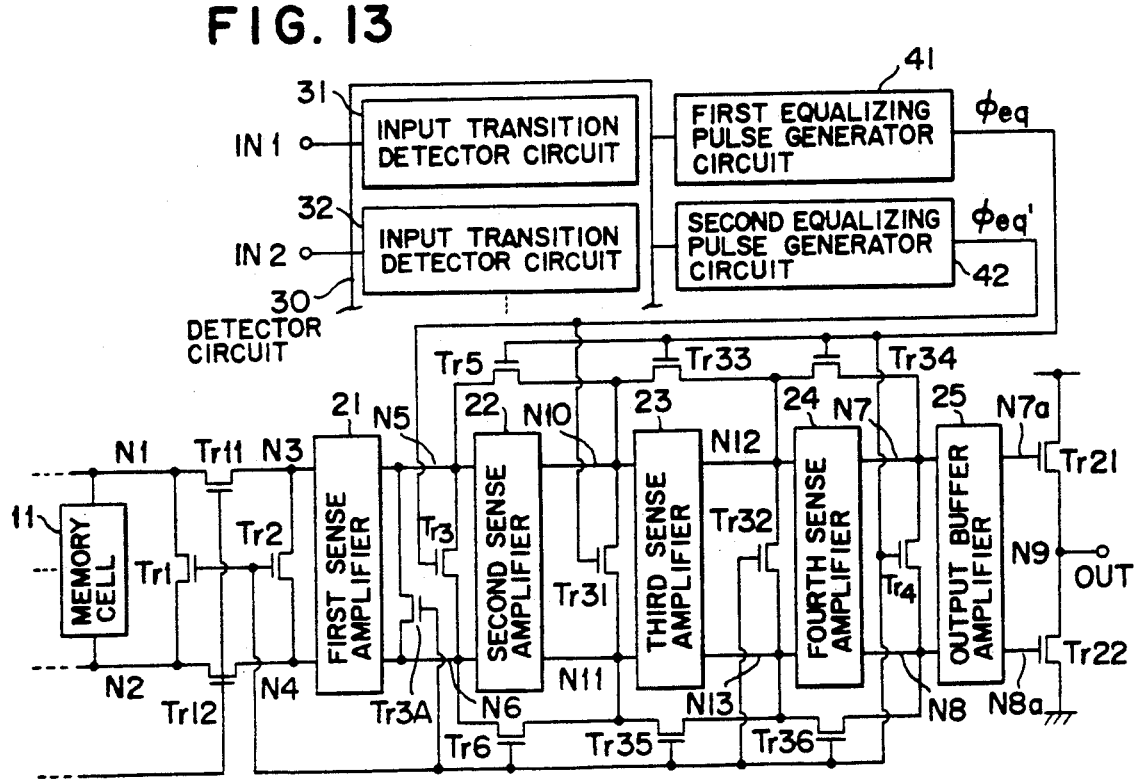
F I G. 14

DATA READ CIRCUIT FOR SEMICONDUCTOR STORAGE DEVICE

FIELD OF THE INVENTION

The present invention relates to a data read circuit for a semiconductor storage device, and more particularly to a data read circuit for a semiconductor storage device of the type that data lines are equalized.

BACKGROUND OF THE INVENTION

FIG. 1 is a block diagram of a data output circuit for a semiconductor storage device incorporated herein to disclose the background art of this invention. As seen from FIG. 1, data are read from a memory cell 11 via bit lines N1 and N2. The data on the bit lines N1 and N2 are equalized by a bit line equalizing transistor Tr1. The bit line N1 is connected to a data line N3 via a column selecting transistor Tr11. The bit line N2 is connected to a data line N4 via a column selecting transistor Tr12. The transistors Tr11 and Tr12 are controlled by a control line N11 to turn on or off so that the bit lines N1 and N2 are connected to or disconnected from the data lines N3 and N4, respectively. To the control line N11, there is applied a decoded signal of an address signal. The data lines N3 and N4 are equalized by an input/output line equalizing transistor Tr2. The input/output lines N3 and N4 are connected to a first sense amplifier (differential amplifier) 21. All sense amplifiers in the following description are made of a differential amplifier whose data relationship is shown in FIG. 2. The outputs from the first sense amplifier 21 are delivered onto first sense amplifier output data lines N5 and N6. Between the first sense amplifier output data lines N5 and N6, there is connected a data line equalizing transistor Tr3. The outputs from the first sense amplifier 21 are equalized by the transistor Tr3. The data on the data lines N5 and N6 are inputted to a second sense amplifier 22. The outputs from the amplifier 22 are delivered to second sense amplifier output data lines N7 and N8. Between the data lines N5 and N7, there is connected an input/output shorting transistor Tr5. Between the data lines N6 and N8, there is connected an input/output shorting transistor Tr6. The transistors Tr5 and Tr6 operate to short the inputs and outputs of the second sense amplifier 22. The second sense amplifier output data lines N7 and N8 are connected to an output buffer amplifier 25 whose particular configuration is shown in FIG. 3. An output equalizing transistor Tr4 is connected between the data lines N7 and N8 on the input side of the output buffer amplifier 25, to equalize the data on the lines N7 and N8. There are connected to the output side of the output buffer amplifier 25, output buffer transistors Tr21 and Tr22. Data is outputted from the interconnection node of the transistors Tr21 and Tr22.

An equalizing pulse $\Phi_{eq}$ is supplied from an equalizing pulse generator circuit 40 to the gates of the transistors Tr1 to Tr6. The equalizing pulse generator circuit 40 is controlled by a detector circuit 30 which detects a change in address signal. The detector circuit 30 is constructed of input transition detector circuits 31, 32, ... to which applied are addresses IN1, IN2, ..., respectively. Each of the input transition detector circuits 31, 32, ... has a circuit configuration such as shown in FIG. 4. Signal waveforms at various nodes of each of the circuits 31, 32, ... are shown in FIG. 5. The relationship between the detector circuit 30 and equalizing pulse generator circuit 40 is shown in FIG. 6. The number of inverters IV in the circuit 40 depends upon the capacitance of a load connected to this circuit.

Next, the operation of the circuit shown in FIG. 1 will be described with reference to the timing chart shown in FIGS. 7 and 8 the difference between which is the width of a pulse shown in FIGS. 7(b) and 8(b). Referring to FIGS. 7 and 8, FIGS. 7(a) and 8(b) represent the transition state of address inputs IN1 and IN2, FIGS. 7(b) and 8(b) represent the equalizing pulse $\Phi_{eq}$, FIGS. 7(c) and 8(c) represent the state of the first sense amplifier output data lines N5 and N6, FIGS. 7(d) and 8(d) represent the state of the second sense amplifier output data lines N7 and N8, and FIGS. 7(e) and 8(e) represent the state of an output (N9).

At time t1, addresses IN1, IN2, ... transit. The input transition detector circuits 31, 32, detect address transition. The detected signal is supplied to the equalizing pulse generator circuit 40 which accordingly outputs the equalizing pulse $\Phi_{eq}$ as shown in FIG. 2(b) at time t2 in synchronization with the address change. This equalizing pulse $\Phi_{eq}$ causes the transistors Tr1 to Tr6 to turn on during the period from time t2 to t3. Namely, the transistor Tr1 is turned on to short the bit lines N1 and N2, the transistor Tr2 is turned on to short the data lines N3 and N4, the transistor Tr3 is turned on to short the data lines N5 and N6, and the transistor Tr4 is turned on to short the data lines N7 and N8. Accordingly, the pairs of data lines are made the same potential because of short-circuits. At the same time, the input/output shorting transistors Tr5 and Tr6 turn on to short the inputs and outputs of the second sense amplifier 22. Accordingly, the potentials of the outputs of the first and second sense amplifiers 21 and 22 take a certain potential $V_{eq}$ determined by the characteristics of transistors constituting the amplifiers, as shown in FIGS. 7(c) and 7(d). When the equalizing pulse $\Phi_{eq}$ falls down at time t3, the transistors Tr1 to Tr6 turn off. The data from the new memory cell selected by the new address are read via the bit lines N1 and N2, and column selecting transistors Tr11 and Tr12, to the data lines N3 and N4. The data are supplied via the first and second sense amplifiers 21 and 23, and output buffer amplifier 25 to the output buffer transistors Tr21 and Tr22. An output as shown in FIG. 7(e) is obtained at the output node N9.

With the above operation, data can be read from a memory cell without adversely affected by the contents of cell data at the preceding address.

In the above-described data output device, the equalizing pulse performs an equalization function as well as a function to inhibit data on the data lines to be transferred during the equalization operation. In order to read data from a memory cell at high speed, it is necessary to speed up the fall time of the equalizing pulse $\Phi_{eq}$. It is necessary therefore (1) to make the pulse width of the equalizing pulse narrow or (2) to shorten the period from when an address transition is detected to when the equalizing pulse $\Phi_{eq}$ rises. However, if a sufficient equalizing effect is desired by using the equalizing pulse $\Phi_{eq}$ having a short pulse width, it becomes necessary to obtain a high conductance gm of the transistors Tr1 to Tr6, which generally results in an increase of the gate width of a MOS transistor and hence in an increase of the gate capacitance. The increase of the gate capacitance results in an increase of the load capacitance $C(\Phi_{eq})$ connected to the equalizing pulse generating circuit 40. However in general, the number of stages of logical circuits (five stages of inverters IV in the case of FIG. 6) of the equalizing pulse generator circuit 40 is designed as small as possible to the extent that its load having the capacitance $C(\Phi_{eq})$ can be driven without delay and the equalizing pulse $\Phi_{eq}$ can rise and fall at high speed. Because of this, the number of stages of logical circuits cannot be reduced. If the number of stages were reduced, the establishment of a pulse could be quickened but the load could not be driven sufficiently.

Apart from the above, there is another problem associated with the operation of the transistors Tr5 and Tr6 for shorting the inputs and outputs of the second sense amplifier 22. Specifically, upon establishment of the equalizing pulse $\Phi_{eq}$, the transistors Tr5 and Tr6 short the inputs and inverted outputs of active elements of the second sense amplifier 22 so that the active elements enter a negative feedback operation. Therefore potentials at the inputs and outputs oscillate and converge to the potential $V_{eq}$. If the width of the equalizing pulse $\Phi_{eq}$ is made shorter, this pulse may start terminating before the oscillation converges sufficiently. In this case, as shown in FIGS. 8(c) and 8(d), convergence of oscillation of the potentials at the data signal lines N5 and N6 is not satisfactory at time t3 when the equalizing pulse $\Phi_{eq}$ starts falling down. The second sense amplifier 22 therefore amplifies an insignificant potential difference between the data signal lines N5 and N6, resulting in a considerable read time delay. As seen from the foregoing description, it is necessary to set the width of the equalizing pulse $\Phi_{eq}$ to have a sufficient margin. The need to broaden the pulse width has been an obstacle against high speed data read.

As described above, the equalizing method for a data output device according to the background art does not provide stable data read at high speed, which has been a bottleneck for high system performance, especially for multi-bit systems having a number of data lines.

SUMMARY OF THE INVENTION

The present invention has been made in consideration of the above problems and aims at providing a data read circuit for a semiconductor storage device capable of shortening the time required for equalizing the data lines during a data read cycle, and realizing high speed access.

A first equalizing pulse is applied to second switching means for equalizing the outputs of a sense amplifier having complementary data lines for receiving input data, and to third switching means for equalizing the input and output of the sense amplifier. A second equalizing pulse establishing earlier than the first equalizing pulse is applied from second equalizing pulse generator means to first switching means. As a result, the output state of the sense amplifier is substantially established in accordance with the equalizing results obtained by first switching means. Thereafter, in accordance with the first equalizing pulse, the equalizing operation is carried out stably at high speed.

As stated above, according to the present invention, it is possible to realize an establishment of an equalizing pulse at an earlier timing and a setting of short pulse width. Accordingly, the terminating timing of the equalizing pulse can be quickened, and high speed reading of data from a memory cell can be realized without considerably modifying a conventional system.

BRIEF DESCRIPTION OF THE DRAWINGS

FIGS. 7 and 8 are timing charts illustrating the operation of the circuit shown in FIG. 1;

FIGS. 13 and 14 show modifications of the embodiment shown in FIGS. 9 and 12, respectively.

DESCRIPTION OF THE PREFERRED EMBODIMENTS

The embodiments of this invention will be described with reference to the accompanying drawings.

Figure 1:
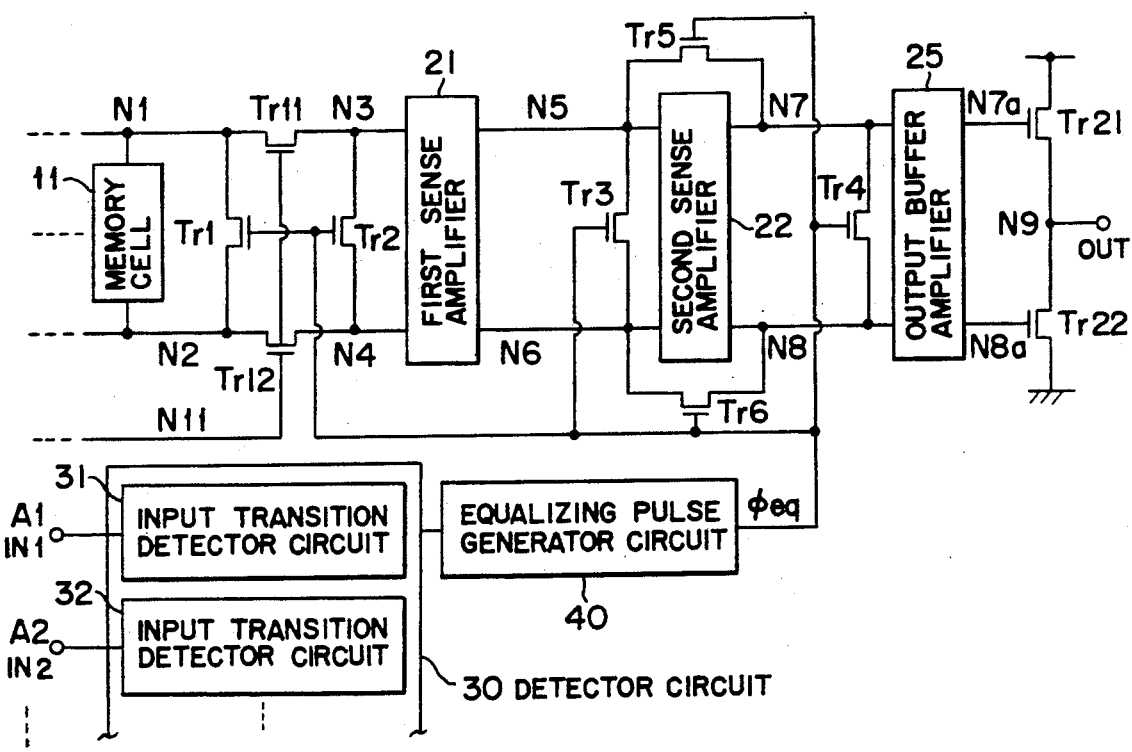
FIG. 1 shows a data read circuit according to the background art.
Figures 2, 3:
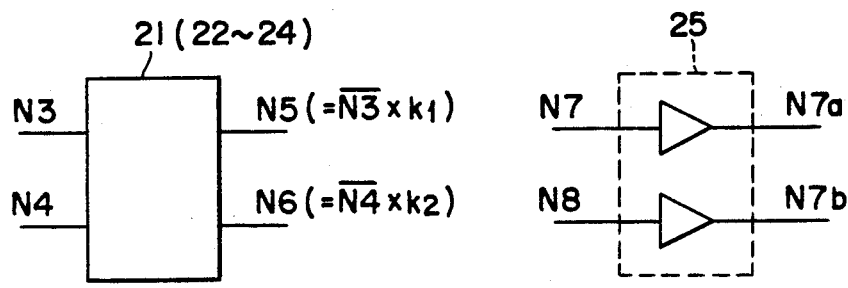
FIG. 2 illustrates the input/output relationship of the sense amplifier.
FIGS. 3 and 4 show the configuration of the output buffer and address input transition detector circuit, respectively.
Figure 4:
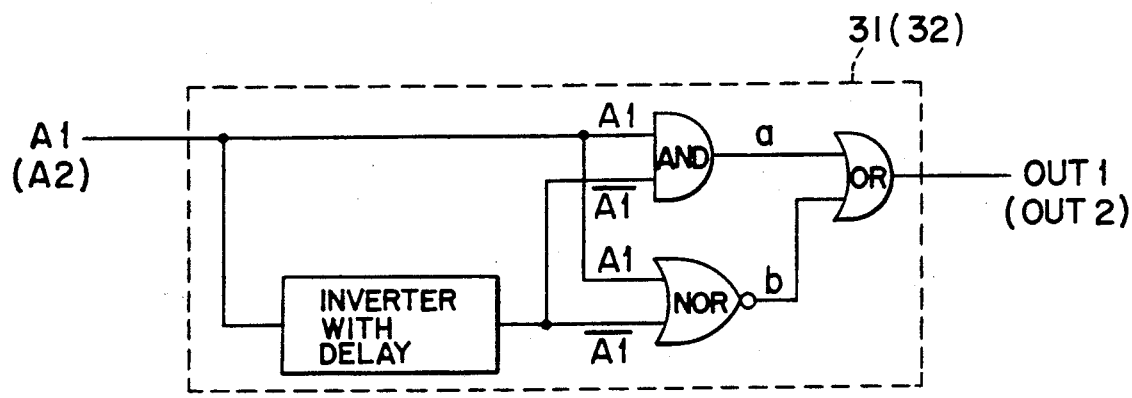
Figure 5:
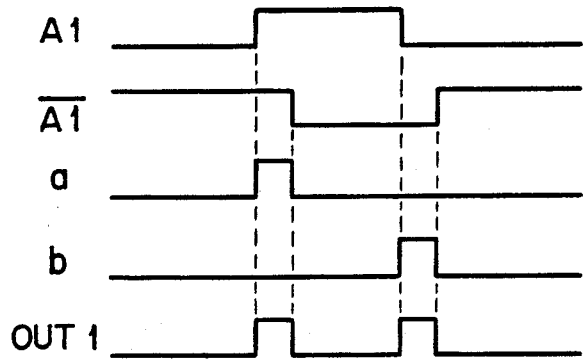
FIG. 5 is a timing chart illustrating the operation of the circuit shown in FIG. 4.
Figure 6:
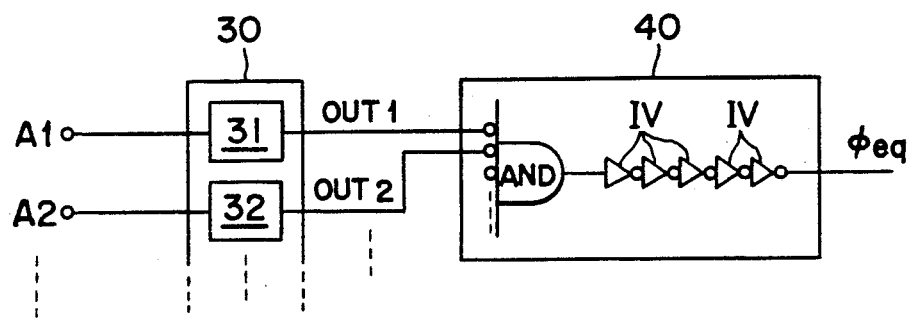
FIG. 6 shows the configuration of the address input transition detector circuit and equalizing pulse generator circuit.
Figure 9:
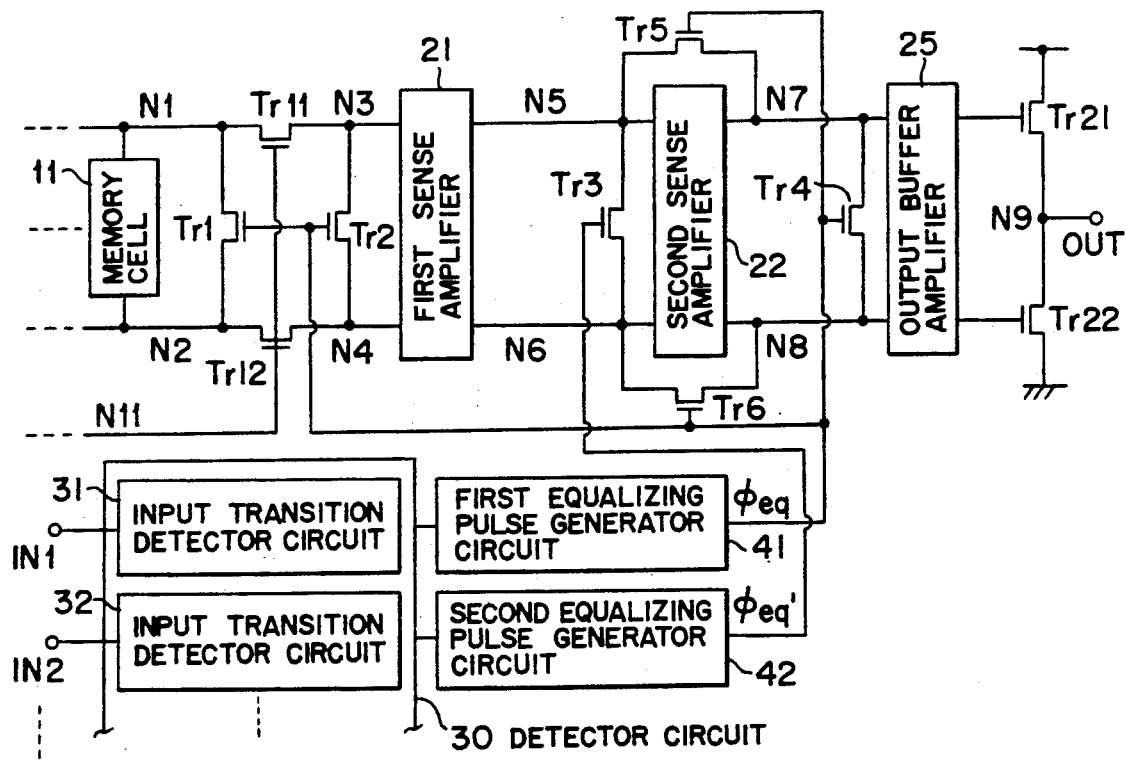
FIG. 9 shows an embodiment of this invention.
Figure 11:
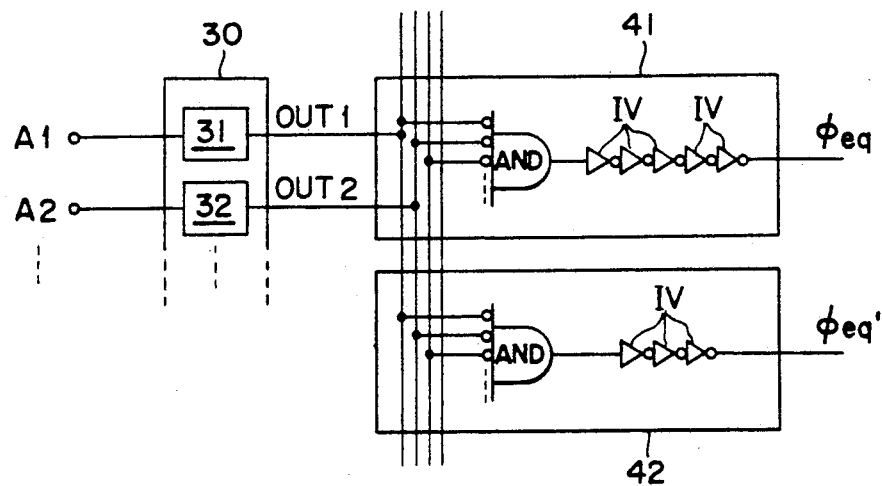
FIG. 11 shows examples of the address input transition detector circuit, first and second equalizing pulse generator circuits.

FIG. 9 is a block diagram showing the data output device according to an embodiment of this invention. In FIG. 9, like elements to those shown in FIG. 1 are represented by using identical reference numerals. As seen from FIG. 11, a first equalizing pulse generator circuit 41 shown in FIG. 9 has the same structure as that of the equalizing pulse generator circuit 40 shown in FIG. 1. A load capacitance $C(\Phi_{eq})$ is coupled to this circuit 41. The circuit 41 generates a first equalizing pulse $\Phi_{eq}$ in accordance with the address change detection signal from input transition detector circuits 31, 32, . . . . This equalizing pulse is applied to transistors Tr1, Tr2, Tr5, Tr6, and Tr4. A second equalizing pulse generator circuit 42 generates a second equalizing pulse $\Phi_{eq}'$ in accordance with the address change detection signal from the input transition detector circuits 31, 32, . . . . This equalizing pulse $\Phi_{eq}'$ is applied to an data line equalizing transistor Tr3. This circuit 42 is constructed as shown in FIG. 11. Since the load capacitance $C(\Phi_{eq}')$ connected to the circuit 42 is smaller than the load capacitance $C(\Phi_{eq})$ connected to the circuit 41, the number of stages of logical circuits (inverter IV) of the circuit 42 is "3" which is smaller than "5" of the circuit 41. The other structure is similar to that shown in FIG. 1.

Figure 10:
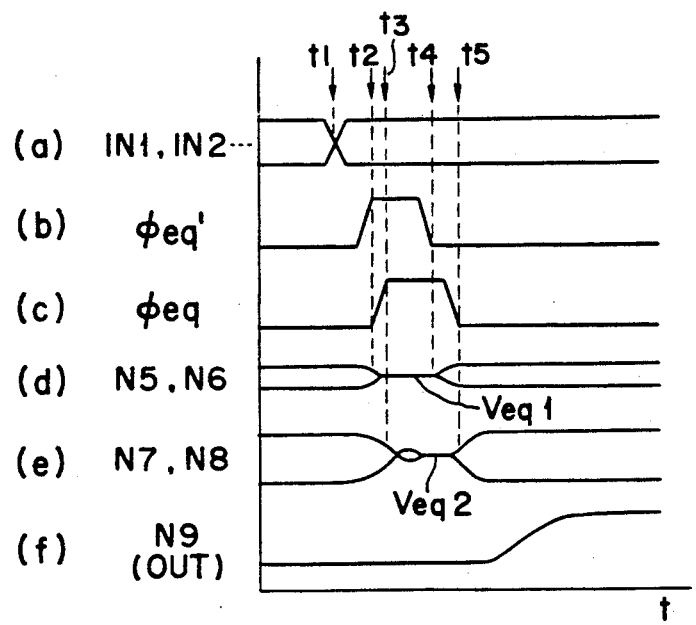
FIG. 10 is a timing chart illustrating the operation of the embodiment circuit shown in FIG. 9.

The operation of the data output device constructed as above will be described with reference to the timing chart shown in FIG. 10. FIG. 10(a) represents the state of change in address inputs IN1, IN2, . . . , FIG. 10(b) represents the equalizing pulse $\Phi_{eq}'$, FIG. 10(c) represents the equalizing pulse $\Phi_{eq}$, FIG. 10(d) represents the state of first sense amplifier output data lines N5 and N6, FIG. 10(e) represents the state of second sense amplifier output data lines N7 and N8, and FIG. 10(f) represents the state of an output.

As shown in FIG. 9, the equalizing pulse $\Phi_{eq}$ from the first equalizing pulse generator circuit 41 is supplied to the gates of the transistors Tr1, Tr2, Tr4, Tr5, and Tr6. The equalizing pulse $\Phi_{eq}'$ from the second equalizing pulse generator 42 is supplied only to the gate of the input/output equalizing transistor Tr3. Consider now the load capacitance $C(\Phi_{eq})$ associated with the equalizing pulse $\Phi_{eq}$ and the load capacitance $C(\Phi_{eq}')$ associated with the equalizing pulse $\Phi_{eq}'$. Obviously, the load capacitance $C(\Phi_{eq}')$ connected to a lesser number of gates is smaller than the load Capacitance $C(\Phi_{eq})$, i.e., $C(\Phi_{eq}) > C(\Phi_{eq}')$. It is therefore possible to construct the second equalizing pulse generator 42 generating the equalizing pulse $\Phi_{eq}'$ with a lesser stage number of logical circuits than that of the first equalizing pulse generator circuit 41 generating the equalizing pulse $\Phi_{eq}$. Accordingly the equalizing pulse $\Phi_{eq}'$ can be established at an earlier timing than the equalizing pulse $\Phi_{eq}$.

As shown in FIG. 10(a), when an address supplied from the address IN1, IN2, ... changes, this change is detected by the input transition detector circuits 31, 32, ... at time t1. The equalizing pulse $\Phi_{eq}'$ is outputted from the second equalizing pulse generator circuit 42 at time t2. The equalizing pulse $\Phi_{eq}$ is thereafter outputted from the first equalizing pulse generator circuit 41 at time t3. Such operation will be detailed hereinafter. As shown in FIGS. 10(b) and 10(c), the equalizing pulse $\Phi_{eq}'$ is established at an earlier timing than the equalizing pulse $\Phi_{eq}$. Accordingly, only the input/output equalizing transistor Tr3 with its gate being supplied with the equalizing pulse $\Phi_{eq}'$ turns on earlier than the other transistors Tr1, Tr2, Tr4 to Tr6. The data lines N5 and N6 at the output side of the first sense amplifier 21 are shorted and the potential on the data lines become near the equalizing potential $V_{eq1}$ specific to the first sense amplifier 21 as shown in FIG. 10(d). At this time t2, the second sense amplifier 22 still remains at its active state. Accordingly, as the input potential changes toward the potential $V_{eq1}$, the output of the second sense amplifier 22 under the active state changes toward a potential $V_{eq2}$ corresponding to the potential $V_{eq1}$. The potentials $V_{eq1}$ and $V_{eq2}$ take the median values between the high level and low level outputs of the first and second sense amplifiers 21 and 22 under the normal active state, respectively. The difference between potentials $V_{eq1}$ and $V_{eq2}$ is far smaller than the potential difference across the source and drain of the input/output shorting transistors Tr5 and Tr6.

Next, as shown in FIG. 10(c), when the equalizing pulse $\Phi_{eq}$ is established at time t3, the transistors Tr1, Tr2, Tr4, Tr5 and Tr6 turn on. Short circuits are thereby formed between the bit lines N1 and N2, between the data lines N3 and N4, between the second sense amplifier output data lines N7 and N8, and between the first sense amplifier output data line N7 and the second sense amplifier output data line N8. Until this time, the output potential of the first sense amplifier 21 has been changing toward the potential $V_{eq1}$, and the output potential of the second sense amplifier 22 receiving the potential $V_{eq1}$ of the second sense amplifier 22 receiving the potential $V_{eq1}$ has been changing toward the potential $V_{eq2}$. Accordingly the potential differences across the sources and drains of the input/output shorting transistors Tr5 and Tr6 are sufficiently small. As shown in FIGS. 10(d) and 10(e), potential oscillation resulting from the negative feedback effects, i.e. the shorting inputs and outputs of the second sense amplifier 22 is small and can converge in a short time. Therefore, there is less possibility of generating an insignificant potential difference between the data lines. As a result, even if the width of the equalizing pulse to be outputted from the first equalizing pulse generator circuit 41 is set short and the equalizing pulse is terminated at an earlier timing (time t5), unnecessary oscillation has been converged almost completely up to this time. Therefore, as shown in FIG. 10(f), it is possible to read data without delay and prevent delays caused by reading unnecessary data due to potential oscillation or the like.

As stated above, according to the embodiment of this invention, the width of the equalizing pulse $\Phi_{eq}$ to be outputted from the first equalizing pulse generator circuit 41 can be made short so that data can be read from a memory cell reliably at high speed.

Figure 12:
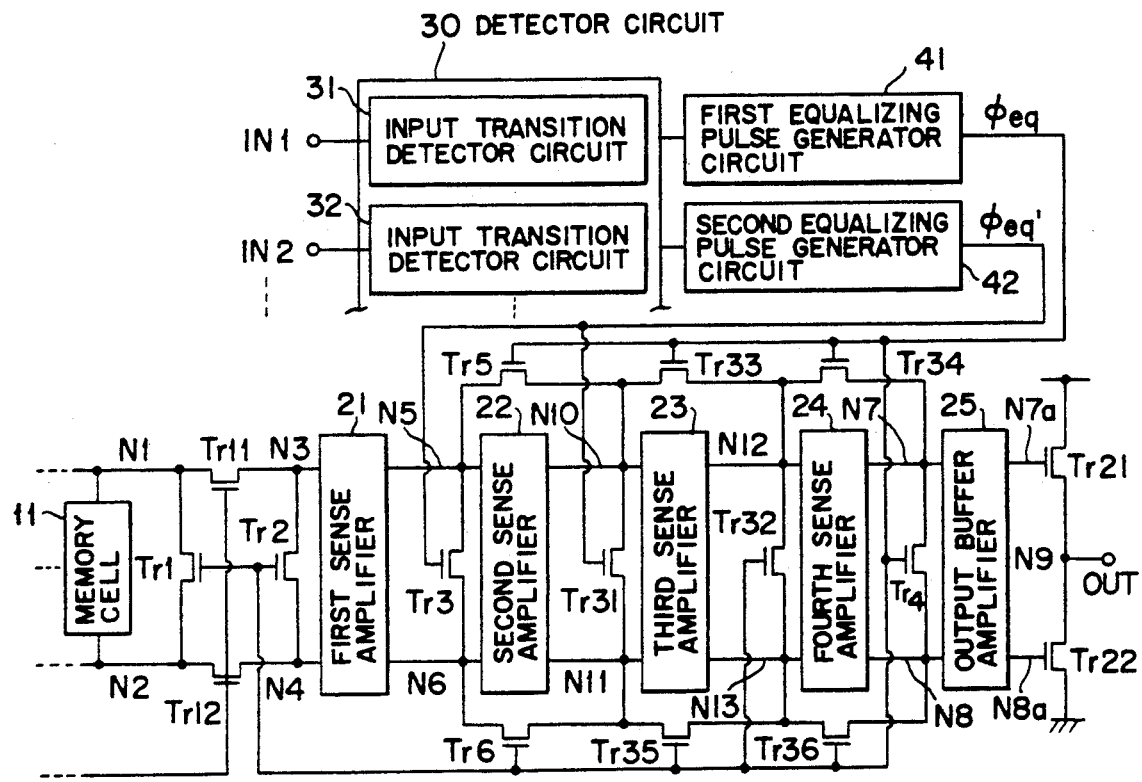
FIG. 12 shows another embodiment of this invention.

FIG. 12 is a block diagram showing another embodiment of this invention. In FIG. 12, like elements to those shown in FIG. 9 are represented by identical reference numerals. The differences of the structure shown in FIG. 12 from that shown in FIG. 9 are as follows. Between the second sense amplifier 22 and output buffer amplifier 25, there are provided cascaded third and fourth sense amplifiers 23 and 24. In addition, there are provided transistors Tr31 and Tr32 for shorting the input sides of the third and fourth sense amplifiers 23 and 24, and transistors Tr33, Tr34, Tr35, and Tr36 for shorting the inputs and outputs of the amplifiers 23 and 24. The equalizing pulse $\Phi_{eq}'$ from the second equalizing pulse generator circuit 42 is used also for shorting the data signal lines at the input side of the third sense amplifier 23. So long as the condition that load capacitance $C(\Phi_{eq}')$ is sufficiently smaller than the load capacitance $C(\Phi_{eq})$ is satisfied, the equalizing pulse $\Phi_{eq}$, may be supplied to a plurality of gates, with the same advantageous effects as the structure shown in FIG. 9 being obtained.

Although the number of sense amplifier stages is five, this may be six or more. In such a case, all sense amplifiers may be divided into forward and backward stage blocks, and the equalizing pulse $\Phi_{eq}'$ from the second equalizing pulse generator 42 may be added to the forward stage block and the equalizing pulse $\Phi_{eq}$ from the first equalizing pulse generator 41 to the backward stage block.

FIGS. 13 and 14 show another embodiment the difference of which from the embodiments shown in FIGS. 9 and 12 is that there is provided a transistor Tr3A for equalizing the output sides N5 and N6 of the first sense amplifier 21, and the gate of this transistor is supplied with the pulse $\Phi_{eq}$ from the first equalizing pulse generator 41.

Reference signs in the claims are intended for better understanding and shall not limit the scope.

What is claimed is:

1. A data read circuit for a semiconductor storage device comprising:
   a sense amplifier (22) to which is inputted data of a memory cell (11) selected according to an address via a pair of complementary first data lines (N1 to N6) and outputs the inputted and amplified data to a pair of complementary second data lines (N7, N8);
   first switching means (Tr3) for equalizing said pair of complementary first data lines (N5, N6) at the input side of said sense amplifier (22) by making said first data lines conductive with respect to each other;
   second switching means (Tr4) for equalizing said pair of complementary second data lines (N7, N8) by making said second data lines conductive with respect to each other;

third switching means (Tr5, Tr6) for equalizing by making said pair of first data lines (N5, N6) at the input side of said sense amplifier (22) and corresponding ones of said pair of second data lines (N7, N8) conductive with respect to each other;

second equalizing pulse generator means (42) for generating a second equalizing pulse ($\Phi_{eq}'$) when said address is changed and for turning on said first switch means (Tr3) by applying said second equalizing pulse to a control terminal of said first switch means; and first equalizing pulse generator means (41) for generating a first equalizing pulse ($\Phi_{eq}$) when said address is changed and for turning on said second and third switching means (Tr4; Tr5, Tr6) by applying said second equalizing pulse to gate terminals of said second and third switching means;

wherein the load capacitance connected to an output terminal of said second equalizing pulse generator means (42) is set smaller than the load capacitance connected to an output terminal of said first equalizing pulse generating means (41), and wherein the number of stages of logical circuits constituting said second equalizing pulse generator means (42) is smaller than the number of stages of logical circuits constituting said first equalizing pulse generator means (41), and whereby said second equalizing pulse ($\Phi_{eq}'$) from said second equalizing pulse generator means (42) is established earlier than said first equalizing pulse ($\Phi_{eq}$) from said first equalizing pulse generator means (41).

2. A data read circuit according to claim 1, further, comprising a detector circuit (30) for detecting a change of said address, whereby said first and second equalizing pulse generator circuits (41, 42) generate said first and second equalizing pulses ($\Phi_{eq}$, $\Phi_{eq}'$) in response to a signal outputted from said detector circuit (30).

3. A data read circuit according to claim 1, further comprising:

an output buffer (25) for receiving signals from said pair of second data lines (N7, N8); and output buffer transistors including serially connected first and second transistors (Tr21, Tr22) for receiving a pair of complementary outputs from said output buffer (25), the gates of said first and second transistors being applied with one and the other output of said pair of complementary outputs, and the data in a memory cell (11) corresponding to said address being outputted from an interconnection point (N9) between said first and second transistors.

4. A data read circuit according to claim 1, wherein said complementary pair of first data lines (N1 to N6) has another sense amplifier (21) at the intermediate thereof, said pair of data lines (N5, N6) between said other sense amplifier (21) and said sense amplifier (22) are connected together by said first switching means (Tr3), fourth switching means (Tr2) is connected between said pair of first data lines (N3, N4) at the input side of said other sense amplifier (21) for equalizing by making said pair of first data lines (N3, N4) conductive with respect to each other, and a control terminal of said fourth switching means (Tr2) and an output terminal of said second equalizing pulse generator means are connected together.

5. A data read circuit according to claim 4, wherein fifth switching means (Tr11, Tr12) is serially connected between said fourth switching means (Tr2) and said memory cell (11) at the corresponding ones of said complementary first data lines (N1 to N6) for connecting and disconnecting respective ones of said pair of first data lines (N1, N3; N2, N4), sixth switching means (Tr1) is connected between said fifth switching means (Tr11, Tr12) and said memory cell (11) at said complementary pair of first data lines (N1, N2) for equalizing by making said pair of first data lines (N1, N2) conductive with respect to each other, and a control terminal of said sixth switching means (Tr1) is connected to the output terminal of said second equalizing pulse generator means (41).

6. A data read circuit according to claim 1, wherein seventh switching means (Tr3A) is connected in parallel with said first switching means (Tr3), and said first equalizing pulse ($\Phi_{eq}$) is applied to a control terminal of said seventh switching means (Tr3A).

7. A data read circuit for a semiconductor storage device comprising:

a plurality of sense amplifiers (22, 23, 24) sequentially and serially connected by a complementary pair of first data lines (N10 to N13), a complementary pair of second data lines (N1 to N6) being connected to a first stage sense amplifier (22) of said plurality of sense amplifiers, and data of a memory cell (11) selected according to an address being outputted onto said complementary pair of second data lines;

first switching means (Tr3) for equalizing said complementary pair of second data lines (N5, N6) at the input side of said sense amplifier (22) by making said second data lines conductive with respect to each other;

second switching means (Tr31, Tr32) for equalizing said complementary pair of first data lines (N10, N11; N12, N13) by making said first data lines conductive with respect to each other;

third switching means (Tr5, Tr6, Tr33 to Tr36) for equalizing by making said complementary pair of data lines at the input side of each of said plurality of sense amplifiers (22, 23, 24) and corresponding ones of said complementary pair of data lines at the output side of each of said plurality of sense amplifiers conductive with respect to each other;

fourth switching means (Tr4) for equalizing a complementary pair of third data lines (N7, N8) as the output terminals of the last stage sense amplifier (24) of said plurality of sense amplifiers (22 to 24) by making said complementary pair of third data lines conductive with respect to each other;

second equalizing pulse generator means (42) for generating a second equalizing pulse ($\Phi_{eq}'$) when said address is changed and for turning on said first switch means (Tr3) and at least the first stage second switch means (Tr31) of said second switching means (Tr31, Tr32) by applying said second equalizing pulse to control terminals of said first switch means (Tr3) and said at least the first stage second switch means (Tr31); and first equalizing pulse generator means (41) for generating a first equalizing pulse ($\Phi_{eq}$) when said address is changed and for turning on said second switching means (Tr32) not applied with said second equalizing pulse ($\Phi_{eq}'$) and said third switching means (Tr5, Tr6, Tr33 to Tr36) by applying said first equalizing pulse ($\Phi_{eq}$) to control terminals of said second switching means (Tr32) and said third switching means (Tr5, Tr6, Tr33 to Tr36);

wherein the load capacitance connected to an output terminal of said second equalizing pulse generator means (42) is set smaller than the load capacitance connected to an output terminal of said first equalizing pulse generating means (41), and wherein the number of stages of logical circuits constituting said second equalizing pulse generator means (42) is smaller than the number of stages of logical circuits constituting said first equalizing pulse generator means (41), and whereby said second equalizing pulse ($\Phi_{eq}'$) from said second equalizing pulse generator means (42) is established earlier than said first equalizing pulse ($\Phi_{eq}$) from said first equalizing pulse generator means (41).

8. A data read circuit according to claim 7, further comprising a detector circuit (30) for detecting a change of said address, whereby said first and second equalizing pulse generator circuits (41, 42) generate said first and second equalizing pulses ($\Phi_{eq}, \Phi_{eq}'$) in response to a signal from said detector circuit (30).

9. A data read circuit according to claim 7, further comprising:

an output buffer (25) for receiving signals from said pair of third data lines (N7, N8); and output buffer transistors including serially connected first and second transistors (Tr21, Tr22) for receiving a complementary pair of outputs from said output buffer (25), the gates of said first and second transistors being applied with one and the other output of said complementary pair of outputs, and the data in a memory cell (11) corresponding to said address being outputted from an interconnection point (N9) between said first and second transistors.

10. A data read circuit according to claim 6, wherein said complementary pair of second data lines (N1 to N6) has another sense amplifier (21) at the intermediate thereof, said pair of data lines (N5, N6) between said other sense amplifier (21) and said sense amplifier (22) are connected together by said first switching means (Tr3), fifth switching means (Tr2) is connected between said pair of second data lines (N3, N4) at the input side of said other sense amplifier (21) for equalizing by making said pair of second data lines (N3, N4) conductive with respect to each other, and a control terminal of said fifth switching means (Tr2) and an output terminal of said second equalizing pulse generator means (41) are connected together.

11. A data read circuit according to claim 10, wherein sixth switching means (Tr11, Tr12) is serially connected between said fifth switching means (Tr2) and said memory cell (11) at the complementary second data lines (N1, N3; N2, N4) for connecting and disconnecting said pair of second data lines (N1, N3; N2, N4), seventh switching means (Tr1) is connected between said fifth switching means (Tr11, Tr12) and said memory cell (11) at said complementary pair of second data lines (N1, N2) for equalizing by making said pair of second data lines (N1, N2) conductive with respect to each other, and a control terminal of said seventh switching means (Tr1) is connected to the output terminal of said first equalizing pulse generator means (41).

12. A data read circuit according to claim 7, wherein seventh switching means (Tr3A) is connected in parallel with said first switching means (Tr3), and said first equalizing pulse ($\Phi_{eq}$) is applied to a control terminal of said seventh switching means (Tr3A).

* * * * *